United States Patent [19]

Goff

[11] 4,115,811
[45] Sep. 19, 1978

[54] DATA SLICING APPARATUS AND METHOD

[75] Inventor: Raymond Charles Goff, Farnborough, England

[73] Assignee: Aston Electronic Developments Ltd., England

[21] Appl. No.: 748,232

[22] Filed: Dec. 6, 1976

[30] Foreign Application Priority Data

Dec. 9, 1975 [GB] United Kingdom ............... 50366/75
Feb. 12, 1976 [GB] United Kingdom ................ 5584/76

[51] Int. Cl.$^2$ ............................................... H04N 5/21
[52] U.S. Cl. .................................... 358/167; 358/138
[58] Field of Search ............... 358/133, 138, 141, 142, 358/146, 147, 160, 167, 260, 262, 280

[56] References Cited

U.S. PATENT DOCUMENTS 3,472,958  10/1969  Estock ................................. 358/280
3,982,065  9/1976   Barnaby et al. ..................... 358/147

Primary Examiner—Richard Murray
Attorney, Agent, or Firm—William Anthony Drucker

[57] ABSTRACT

A data slicer including detector means connected to a signal input for detecting the presence of data clock pulses on an incoming signal. Generator means are connected to the detector means for generating a sampling pulse during the time that the presence of the data clock pulses is detected. Filter or delay means are connected to the signal input for establishing the mean level of the incoming clock pulses. Sampler means are connected to the filter or delay means for sampling the mean incoming signal level when established by the filter or delay means during the sampling pulse interval and for storing the sampled signal. Comparator means having a first input are connected to the signal input and a second input connected to the sampler means for receiving and comparing the incoming signal with the sampled signal stored in the sampler means to effect slicing of the data from the incoming signal. As any distortion present on the incoming signal will affect the clock pulses and data equally, by selecting a slicing level determined from the clock pulses, the optimum level for slicing the subsequent data is established.

10 Claims, 10 Drawing Figures

DATA SLICING APPARATUS AND METHOD

BACKGROUND OF THE INVENTION

This invention relates to a data slicing apparatus and method.

Data slicing is a process whereby the incoming signal is compared with a reference level such that should the incoming signal exceed the reference level, the data slicer produces an output in one sense and should the input signal be less than the reference level the data slicer produces an output in the opposite sense. Hence the action of the data slicer is to reconstruct from the incoming signal the original information. The establishment of the correct level about which the data slicer operates is important since the presence of various distortions in the incoming signal will mean that the data signal is no longer symmetrical about any specific reference level.

In television systems it is known to transmit digital data on one or more 'lines' of the video signal. Transmission of digital data along with the normal picture information forms the basis of the operation of teletext systems, e.g. CEEFAX and ORACLE. In the known systems, the incoming video waveform is referred to a fixed voltage level and the data is "sliced" by means of a device which compares the incoming data waveform with a voltage level which bears a fixed relation to the reference level. With such systems, distortions etc., results in the chosen relationship being incorrect and hence the data can be incorrectly sliced and thus impaired or lost.

OBJECT OF THE INVENTION

The object of the invention is to provide a means of adapting the reference level such that the effects of distortions, i.e. bandwidth limitations, group delay, co-channel interference etc., are minimised.

SUMMARY OF THE INVENTION

According to the invention there is provided a data slicer comprising detector means connected to a signal input for detecting the presence of data clock pulses on an incoming signal; generator means connected to said detector means for generating a sampling pulse during the time that the presence of the data clock pulses is detected; averaging means connected to said signal input for establishing the mean level of the incoming clock pulses; sampler means connected to said averaging means for sampling the mean incoming signal level when established by said averaging means during the sampling pulse interval and for storing the sampled signal; comparator means having a first input connected to said signal input and a second input connected to the sampler means for receiving and comparing said incoming signal with the sampled signal stored in said sampler means to effect slicing of said data from the incoming signal.

Further according to the invention there is provided a method of slicing data comprising detecting the presence of data clock pulses on an incoming signal; generating a sampling pulse during the time that the presence of the data clock is detected; establishing the mean level of the clock pulses; sampling the mean level during the presence of the sampling pulse and storing the sample; and comparing the incoming signal with the stored sample to effect slicing of data present on the incoming signal.

BRIEF DESCRIPTION OF THE DRAWINGS

The invention will now be described by way of example with reference to the accompanying drawings, in which.

DESCRIPTION OF PREFERRED EMBODIMENTS

Figure 1:
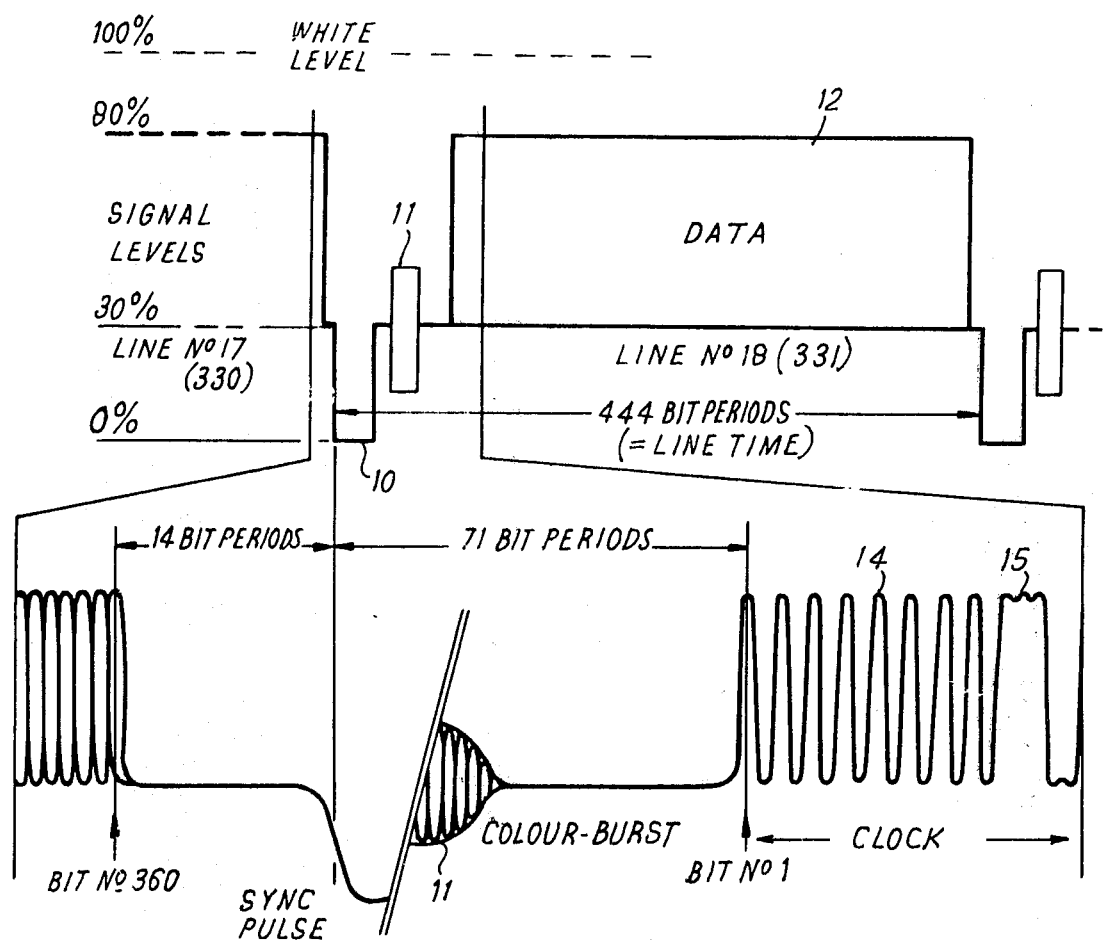
FIG. 1 shows a typical video signal with data and synchronizing information thereon.

Normal television pictures are formed from a frame of several hundred lines (e.g. 625 lines), these lines being subdivided typically into two fields. However, a blanking period occurs at the end of each field and before the start of the next field which is used in teletext systems to accommodate the necessary data. Thus, in FIG. 1, the incoming signal is shown when data other than normal picture information is being received. This data is transmitted on lines 17 and 18 and lines 330 and 331, i.e. on two lines per field.

The incoming signal on these lines includes a horizontal sync pulse 10, a colour burst 11 and data block 12. The data in block 12 is preceded by a burst of clock synchronization pulses 14 and by several pulses forming a frame code identification signal 15. This identification signal 15 ensures that the data following is only received by its own system, thus avoiding reception of unwanted data from other teletext systems.

Figure 2:
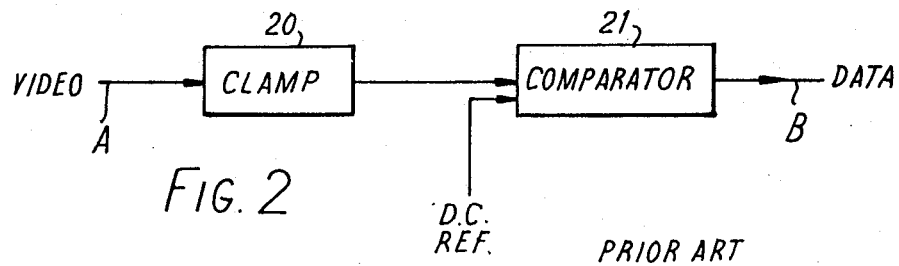
FIG. 2 shows a known arrangement for slicing the data from the incoming video signal.
Figure 3:
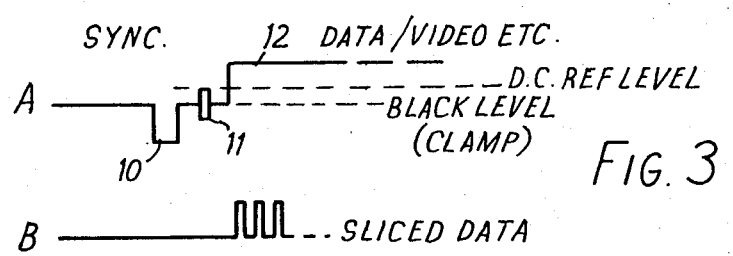
FIG. 3 shows the output signal produced from the FIG. 1 arrangement in comparison with the input signal.

The way in which the data is handled is shown in its basic form in FIG. 2. The video signal with data thereon is received by a 'slicing' circuit which includes a clamp 20 and a comparator 21. The clamping level (see FIG. 3, waveform A) is shown as being that correspondingly to black level but could alternatively be clamped to the bottom of the sync pulse 10. The output from clamp 20 is passed to the comparator 21 which compares this output with a reference level. This D.C. reference is chosen to be sufficiently high to reject colour burst information. Thus, levels above the reference are passed by the comparator and includes sliced data from block 12, including clock pulses 14 and frame code 15. The sliced data (see FIG. 3, waveform B) is available for processing in further circuitry (not shown) in the normal way. This further circuitry includes a decoder and storage means (e.g. Random Access Memory) and a character generator for producing words and figures etc., from the stored information when required.

Unfortunately the slicer of FIG. 2 also allows distortion, noise and spurious signals to be accepted along with the incoming data if these exceed the reference level and therefore corruption of the data can occur.

Figure 4:
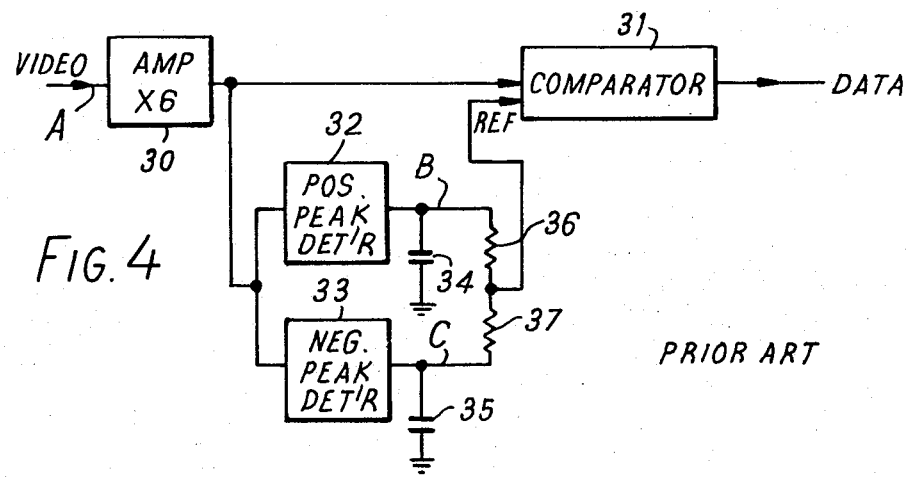
FIG. 4 shows a further known arrangement with improved performance under poor reception conditions.
Figure 5:
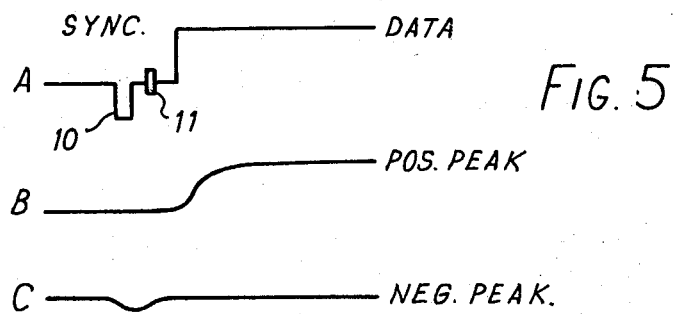
FIG. 5 shows the peak signals detected by the arrangement of FIG. 4.

The improved known arrangement of FIG. 4 goes some way to overcoming this problem. The incoming signal is amplified in amplifier 30 before being passed to comparator 31. The amplified signal is also passed to a positive peak detector 32 and a negative peak detector 33. The detected peaks (see FIG. 5, waveforms B and C) are held in capacitors 34 and 35 for approximately one line period (50μs). The arithmetic mean of these two voltages is derived via a resistive divider 36, 37 and that mean is used as the reference input to the comparator 31. Although the circuit of FIG. 4 is more tolerant of noise and spurious signals since it averages the signals over one line period, it does not have an effect on distortion, which distortion may occur due to bandwidth limitation, group delay, co-channel interference, etc.

Figure 6:
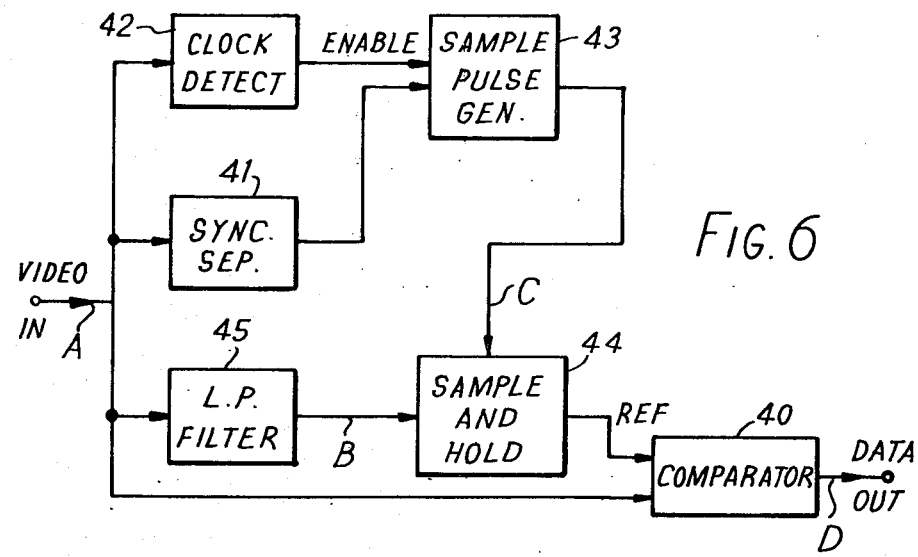
FIG. 6 shows an embodiment of the slicer of the present invention.
Figure 7:
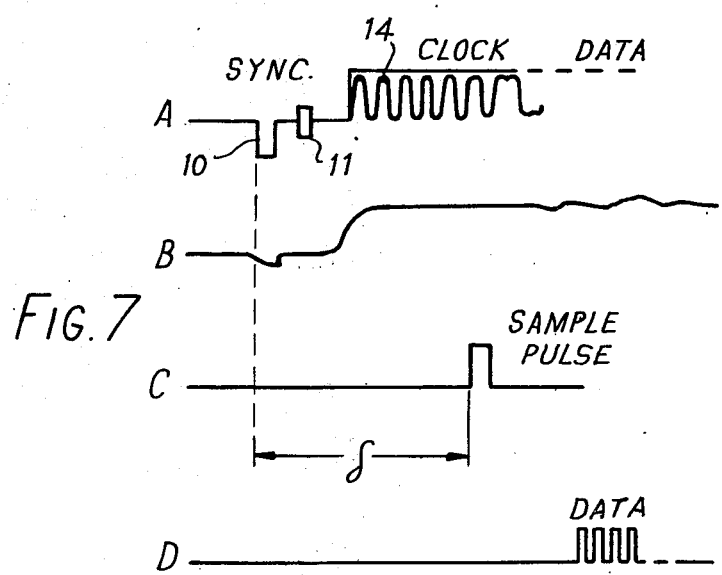
FIG. 7 shows the various waveforms occurring in the slicer of FIG. 6.

In FIG. 6 an embodiment of the slicer of the present invention is shown in which distortion can be largely compensated for. In this arrangement the video signal passes directly to a comparator 40. The video signal is also received by a sync separator circuit 41 which detects the start of the sync pulse 10. The incoming signal is also received by a clock detector 42 which detects the presence of the clock pulses 14 prior to the data thus identifying the data carrying lines. The output of detector 42 is received by sample pulse generator 43 which generator also receives the detected sync pulse 10. The generator 43 produces a sample pulse which is used for controlling a sample hold circuit 44. This sample pulse (see FIG. 7, waveform C) is delayed by a period δ relative to the leading edge of the sync pulse detected by sync separator 41. The sample pulse generator 43 could comprise for example two monostables connected in series. The first monostable would be triggered from the leading edge of the incoming sync pulse and the time period of this first monostable set to produce the delay δ. At the end of this time period the second monostable would be triggered to produce the sample pulse. To ensure that the sample pulse is only produced for data carrying lines, this second monostable would include an enabling input which would cause the second monostable to produce the sample pulse only when receiving an enable signal from clock detector 42. Alternatively, the sample pulse and delay δ could be provided via delay lines or other delay means known in the art. The sample hold circuit 44 receives the incoming video via a low-pass filter 45. The filter 45 establishes the mean level of the clock pulses (see FIG. 7, waveform B) and, on receipt of the sample pulse from the generator 43, the sampler 44 samples and holds this level. Although the sampling pulse interval is shown as a short period occurring towards the end of the clock pulses, this period could be extended to a longer period, which period could extend throughout the clock pulse period.

The sampling of the filter output at or near the end of the clock pulse train ensures that the filter acts upon the maximum number of clock pulses in that train. The voltage held in sampler 44 is used as the reference level for comparator 40. Since any distortion on the incoming video signal will be present during both the clock pulse period and the data period, the distortion present on the clock pulses will cause the reference level to comparator 40 to be offset relative to a distortion free signal which which in turn will adjust the comparator output to correspond more closely to the optimum. Thus, any distortion present on the incoming signal is automatically corrected for on a line by line basis.

The circuit of FIG. 6 can be realised using discrete components or separate integrated circuit blocks. Alternatively, with the possible exception of the low pass filter, the circuit could be constructed in the form of a custom built integrated circuit using large scale integration (LSI) techniques. This could be constructed to form only the circuit of FIG. 6, or alternatively to include the other parts of the teletext circuit configuration.

Figure 8:
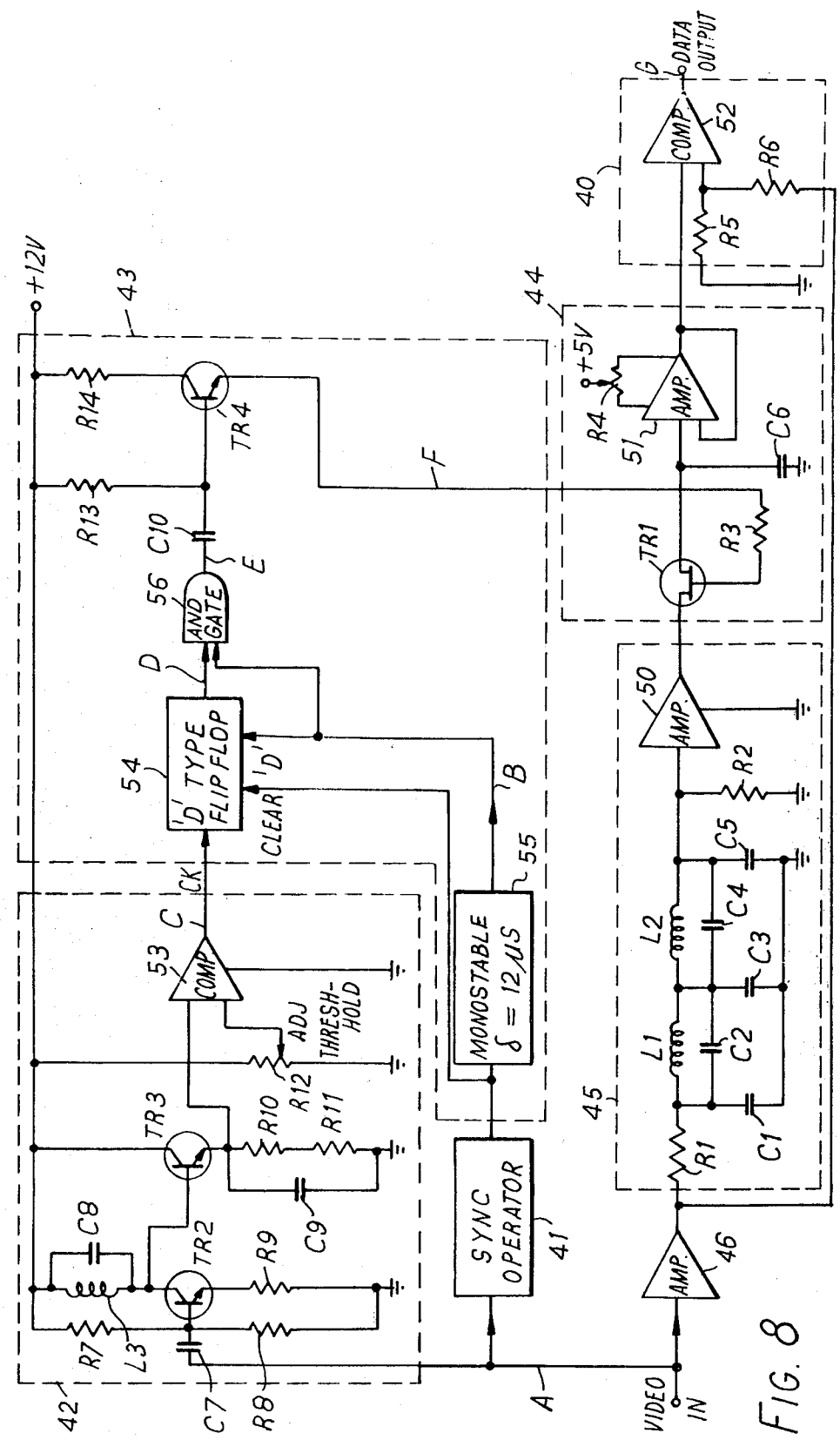
FIG. 8 shows a circuit diagram showing one arrangement for producing the slicer of FIG. 6.
Figure 8:
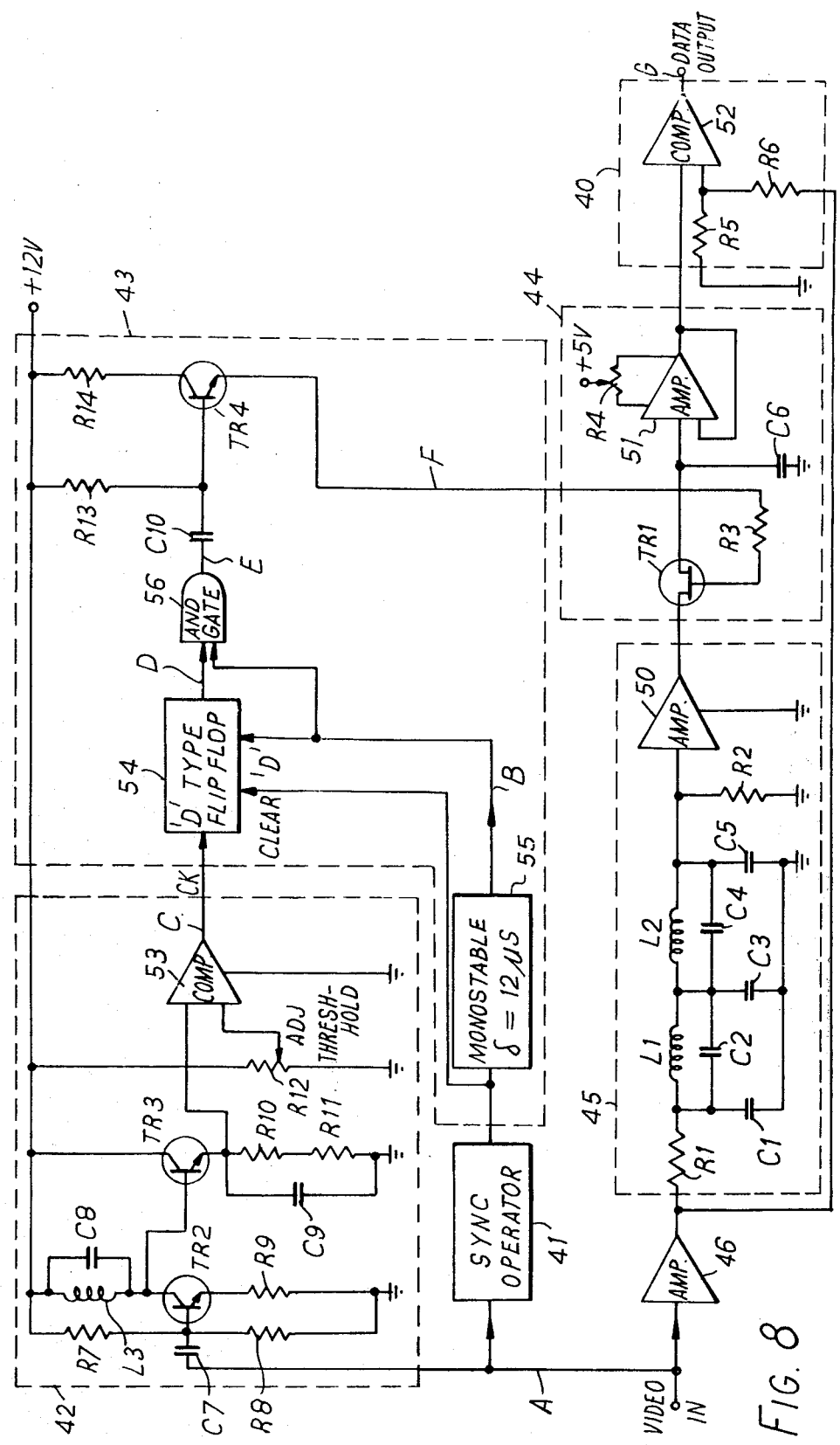

The circuit of FIG. 8 shows one arrangement for producing the slicer of FIG. 6. The blocks 40 and 45 of FIG. 8 correspond to the similarly numbered circuit blocks of FIG. 6. In addition, an input buffer amplifier 46 is provided prior to the input of the filter 45 and comparator 40. Buffer amplifiers are well known in the art.

The low pass filter 45 (cut off below 3.5 MHz) includes a network comprising inductors L1, L2 and capacitors C1–C5 and associated resistors R1, R2 and buffer amplifier 50 (e.g. National Semiconductor LM 318). Sample and hold circuit 44 includes a sampling switch provided by Field Effect Transistor TR1 which receives the sample pulse at its gate electrode via resistor R3. The sampled voltage is stored in capacitor C6. To prevent drain on the stored voltage, a high input impedance buffer amplifier 51 (e.g. Signetics NE 536) together with associated resistor R4 is connected to the storage capacitor. The output of the amplifier 51 is applied to the reference input of a comparator chip 52 (e.g. Signetics NE 521). The incoming video is received via divider R5, R6 so as to equalise the gain of the two channels.

The clock detector 42 receives the video input via capacitor C7 and includes a 3.5 MHz amplifier with transistor TR2 and bias resistors R7, 8, 9 and tuned circuit comprising inductor L3 and capacitor C8. The amplifier output is received by the detecting transistor TR3 with associated resistors R10, R11 and capacitor C9. The detected output is received by comparator 53 (e.g. Fairchild μA 760) which compares this output with a reference level provided by threshold resistor R12. The output of the comparator 53 is used as an enabling signal for the sampling pulse generator 43. This generator 43 receives an input also from sync separator 41. Sync separators are well known in the television art and is, therefore, not described further. The detected sync pulse is received by the 'clear' input of a 'D' type flip flop 54 (e.g. Texas SN 7474) and also by a monostable circuit 55. The comparator output is received by the 'clock' input of the flip flop 54. In this example the monostable 55 has a period of 12 μs. The output of monostable 55 is received by the 'D' input of flip flop 54 and also by AND gate 56. The AND gate receives the output of the flip-flop 54 at its other input. The output of gate 56 is coupled to the sample pulse former comprising transistor TR4, capacitor C10 and resistors R13, 14.

Figure 9:
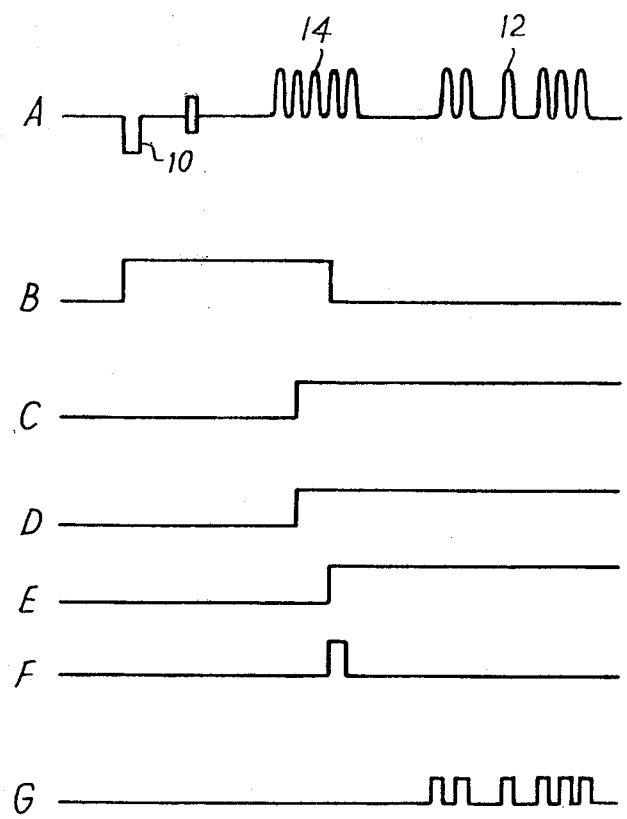
FIG. 9 shows the waveforms associated with the circuit of FIG. 8.

Thus, a sync pulse detected by separator 41 causes monostable 55 to change state (see FIG. 9, waveform B). If clock pulses are also detected on the incoming signal, the comparator changes state (see waveform C) causing a change of state of flip flop 54 (see waveform D). When monostable 55 times out after the predetermined delay, the change in level effects a change of state of gate 56 and a sample pulse is generated by the TR4 circuit (see waveform F). The sample pulse switches TR1 to allow C6 to charge to the filtered incoming clock pulse level during this period when the FET is closed. The comparator 52 compares the incoming video with this reference level to produce the sliced data at its output (see waveform G).

Suitable component values for the above circuit are as follows:

R1, R2, R5, R6, R9, R12, R14 = 1KΩ; R3 = 33KΩ; R7 = 22KΩ; R8 = 2.2KΩ; R10, R11 = 3.3KΩ; R13 = 12KΩ; C6 = 1000pF; C7 = 470pF; C8 = 33pF; C9 = 2200pF; C10 = 56pF; TR1 = 2N5457; TR2, TR3 = BC109; TR4 = BSY 95A.

Figure 10:
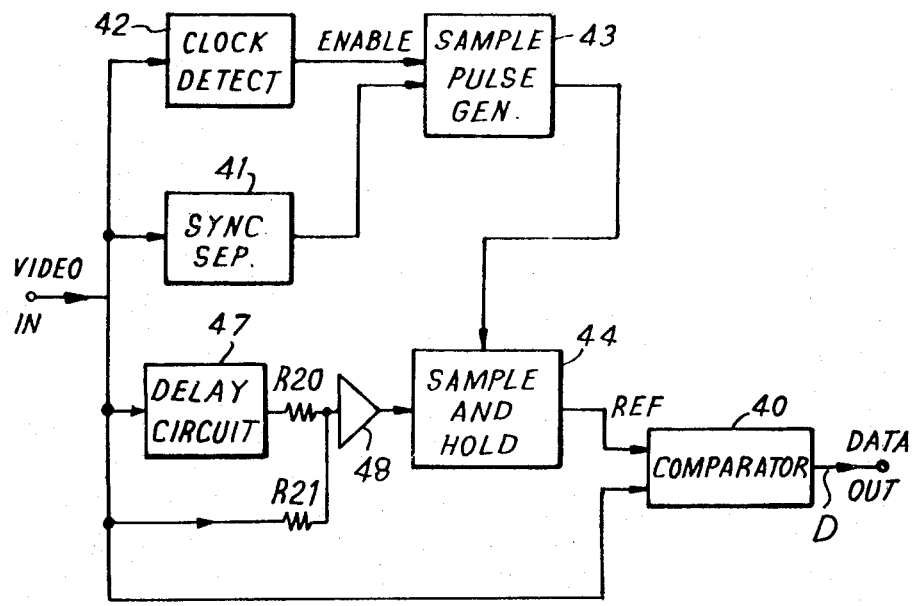
FIG. 10 shows an arrangement similar to FIG. 6, but where the filter is replaced by a delay circuit.

An alternative configuration to that of FIGS. 6 and 8 is shown in FIG. 10 in which the low pass filter 45 is replaced by a delay circuit 47. The delay circuit has a delay equal to half the period of the clock pulses. The output of this delay circuit is connected via resistor R20 to an amplifier 48 which amplifier also receives the incoming video via resistor R21. The signal from the delay circuit and the incoming video signal are thus combined and the amplifier output is fed to the sample and hold circuit 44 for sampling as described above in relation to FIG. 6.

The combining operation of the video signal and the delayed signal results in the clock pulses being effectively cancelled and the output of amplifier 48 corresponds to the mean level.

This configuration removes the necessity of including inductors in the circuit and is, therefore, more easily realised using integrated circuit (LSI) techniques.

Although the particular embodiments described have related to handling video information received on just a view lines of the incoming signal, it is possible that the teletext system could be expanded to include data transmission on all the lines so that display would be exclusively in the form of teletext. The arrangements of FIG. 6 and FIG. 8 would still be capable of handling such signals.

Further, although the particular embodiments described have related to the handling of video signals, it will be seen by anyone skilled in the art that the invention is not restricted to handling video signals, as it would be possible to alter the arrangement of FIG. 6 to handle non-video data.

Normally, the data on incoming signals is preceded by clock pulses or identification pulses or the like. The clock detector 42 can be arranged to detect these pulses as before to cause the production of a sample pulse from generator 43. The clock detector 42 itself could trigger a monostable or other delay means in generator 43 to provide the delay and thus a sync pulse for separator 41 would not be required to allow the circuit to be extended to handle non-video data. Thus, this arrangement would still provide sampling of the incoming pulse level just prior to the start of the actual data to provide an optimum reference signal for the comparator 40.

As any distortion present on the incoming signal will affect the clock pulses and data equally, by selecting a slicing level determined from the clock pulses, the optimum level for slicing the subsequent data is established.

I claim:

1. A data slicer for use with a data signal comprising a burst of clock pulses followed by a sequence of data pulses comprising:
   (a) detector means connected to a signal input for detecting the presence of clock pulses on an incoming signal;
   (b) generator means connected to said detector means for generating a sampling pulse during the time that the presence of the clock pulses is detected;
   (c) averaging means connected to said signal input for establishing the mean level of the incoming clock pulses;
   (d) sampler means connected to said averaging means for sampling the mean incoming signal level when established by said averaging means during the sampling pulse interval and for storing the sampled signal;
   (e) comparator means having a first input connected to said signal input and a second input connected to the sampler means for receiving and comparing said incoming signal with the sampled signal stored in said sampler means to effect slicing of said data pulses from the incoming signal.

2. A data slicer according to claim 1, wherein said generator means includes delay means for delaying the production of said sampling pulse for a predetermined period after the start of a burst of clock pulses to ensure that the mean level of said incoming signal has been established by said averaging means.

3. A data slicing according to claim 2, wherein a sync pulse separator is connected between said signal input and said delay means for detecting a sync pulse on an incoming video signal to provide a delayed trigger pulse for said generator means, the delay period of said delay means being selected to cause said trigger pulse to occur towards the end of a burst of clock signals.

4. A data slicer according to claim 1, wherein said detector means includes a detector circuit sensitive to the frequency of the incoming clock pulses and a comparator having one input connected to the detector circuit and a second input connected to a reference level, the output of said comparator changing state when the signal from the detector circuit exceeds the reference level.

5. A data slicer according to claim 1, wherein said averaging means comprises a delay circuit for delaying the incoming signal and a combining circuit for combining the incoming signal with the delayed signal to establish the mean level.

6. A method of slicing data in the form of a data signal comprising a burst of clock pulses followed by a sequence of data pulses comprising:
   (a) detecting the presense of clock pulses on an incoming signal;
   (b) generating a sampling pulse during the time that the presence of the clock pulses is detected;
   (c) establishing the mean level of the clock pulses;
   (d) sampling the mean level during the presence of the sampling pulse and storing the sample; and
   (e) comparing the incoming signal with the stored sample to effect slicing of data pulses present on the incoming signal.

7. A method according to claim 6, including delaying the production of the sampling pulse for a predetermined period after the start of a burst of clock pulses to ensure that the mean level of the incoming signal has been established.

8. A method according to claim 7, including detecting a sync pulse on an incoming video signal and delaying the production of the sampling pulse for a predetermined period after the sync pulse to ensure that the sampling pulse occurs towards the end of a burst of clock pulses following the sync pulse.

9. A data slicer for use with a data signal comprising a burst of clock pulses followed by a sequence of data pulses comprising:
   (a) detector means connected to a signal input for detecting the presence of clock pulses on an incoming signal;
   (b) generator means connected to said detector means for generating a sampling pulse during the time that the presence of the clock pulses is detected;
   (c) averaging means connected to said signal input for establishing the mean level of the incoming clock pulses;
   (d) sampler means connected to said averaging means for sampling the mean incoming signal level when established by said averaging means during the sampling pulse interval and for storing the sampled signal;
   (e) comparator means having a first input connected to said signal input and a second input connected to the sampler means for receiving and comparing said incoming signal with the sampled signal stored in said sampler means to effect slicing of said data pulses from the incoming signal, and wherein said generator means includes a flip flop circuit having one input connected to the output of said detector means and a second input connected to the output of a monostable, and an AND gate having one input connected to the output of the flip flop circuit and a second input connected to the monostable output, whereby the AND gate changes state to effect production of a sampling pulse when the monostable times out coincident with the detection of the clocking pulses.

10. A data slicer for use with a data signal comprising a burst of clock pulses followed by a sequence of data pulses comprising:
   (a) detector means connected to a signal input for detecting the presence of clock pulses on an incoming signal;
   (b) generator means connected to said detector means for generating a sampling pulse during the time that the presence of the clock pulses is detected;
   (c) averaging means connected to said signal input for establishing the mean level of the incoming clock pulses;
   (d) sampler means connected to said averaging means for sampling the mean incoming signal level when established by said averaging means during the sampling pulse interval and for storing the sampled signal;
   (e) comparator means having a first input connected to said signal input and a second input connected to the sampler means for receiving and comparing said incoming signal with the sampled signal stored in said sampler means to effect slicing of said data pulses from the incoming signal, and wherein said averaging means comprises a low pass filter.

* * * * *